AUTOMATIC GAIN CONTROL

Filed Nov. 29, 1954

INVENTORS.
Eugene O. Keizer &
Martin G. Kroger
BY [signature]
ATTORNEY 2,735,934

AUTOMATIC GAIN CONTROL

Eugene O. Keizer, Princeton, N. J., and Marlin G. Kroger, Oak Park, Ill., assignors to Radio Corporation of America, a corporation of Delaware Application November 29, 1954, Serial No. 471,779
The terminal 15 years of the term of the patent to be granted has been disclaimed
6 Claims. (Cl. 250—20)

The present invention relates to improvements in variable capacitance means capable of control by temperature change in a manner which permits a single capacitance unit to provide a plurality of variable capacitance elements whose temperature coefficients may be variously related to one another.

The present invention further relates to improvements in electrically responsive variable capacitance control means for use in automatic gain control circuits for optimizing operating conditions as a function of received signal strength.

In electronic circuits there frequently arises the need for a variable capacitance unit or device, the capacitance value of which may be controlled as a function of an electrical signal. A temperature responsive variable capacitance unit has heretofore been employed in a frequency determining relation to an oscillator circuit. Output signal from a frequency discriminator circuit connected with the oscillator is then caused to apply a varying amount of heat to the temperature responsive capacitor in such a fashion as to stabilize the frequency of oscillator operation.

In circuit application where a temperature responsive or thermo type capacitor is required to be responsive to a single control signal to control only one parameter of electrical circuit, such a control may not unduly increase overall circuit manufacturing costs. However, in circuit applications where in response to a single control signal, a plurality of variable capacitance changes are to be made at various points within a circuit, and especially where direction of capacitance change at one point is desirably different from that required of another point, separate variable capacitance units for controlling each change may cause manufacturing costs to become prohibitively high.

A particularly good example of where a number of variable capacitance means in which the capacitance change required in each means in response to a given control signal variation may not be uniform or of the same sense, is found in automatic gain control circuits. Signal responsive variable capacitance units have been proposed to change an automatic gain control circuit operating mode from keyed to unkeyed operation as a function of received signal strength. This is shown to be important in television signal reception where it is more desirable to have keyed automatic gain control operation during the reception of weaker signals and unkeyed automatic gain control circuit operation during the reception of stronger signals. This enhances noise immunity under weak signal conditions and prevents so-called AGC "lock-out" during strong signal reception.

A signal responsive variable capacitance means have been employed to change the effective time constant or response speed of a television automatic gain control circuit as a function of received signal strength. In this way, the fast response necessary for airplane flutter correction under weak signal conditions may be realized along with a slower response for strong signal reception as required to reduce the influence that the vertical synchronizing signal has on the developed automatic gain control voltage. Signal responsive variable capacitance means have also been found useful for changing the amplitude of keying pulses used in keyed automatic gain control systems as a function of received signal strength. By such means noise bursts may be caused to influence the automatic gain control voltage less during the reception of weak signals (by reducing the amplitude of keying pulse) without compromising the effect of automatic gain control circuit gain during the reception of stronger signals during which time the keying pulses are increased in amplitude.

In order to realize all of the advantages above discussed in a single automatic gain control circuit it has heretofore been thought necessary to actually employ separate variable capacitance units connected at predetermined points in the automatic gain control circuit. There is also involved the likelihood that in a particular automatic gain control circuit it will be necessary to increase the capacitance at one point therein to produce one of the above correction effects while being necessary to reduce the capacitance at another point to produce another of the above correction effects.

It is, therefore, an object of the present invention to provide an improved variable capacitance unit which in response to a single control signal may provide independent control of a plurality of capacitance elements.

It is yet another object of the present invention to provide in a unitary structure a multi-element signal responsive variable capacitance means in which the direction of capacitance change in at least two of the individual capacitance elements may be opposite to one another in response to a given control signal change.

It is another object of the present invention to provide a unitary structure having a plurality of separate variable capacitance units all subject to control by a common control current.

It is still a further object of the present invention to provide a current responsive variable capacitance device which can be employed in conjunction with television receiver automatic gain control circuits to optimize various operating modes of the gain control circuit relative to received signal strength.

The present invention in one of its more general forms may be practiced in the form of a variable capacitance unit comprising a relatively thin wafer of high resistivity material having electrically conductive electrodes fastened to the surface thereof so as to permit a heater current to be passed through the wafer. Two or more blocks of dielectric material having different temperature coefficients are then fixed to one of the surfaces of the wafer in heat transferring relation thereto and such that current flow through the wafer tends to control the temperature of the dielectric materials. Conductive electrodes are then applied to the dielectric materials so as to define capacitance elements whose value of capacity is thereby rendered a function of control current through the wafer.

In the application of the present invention to television receiving systems, such variable capacitance elements may be connected with the television receiver automatic gain control circuit to control the correction response time, operating mode (keyed or unkeyed) and intensity of keying as a function of received signal strength as discussed above. This may be accomplished by providing the current requirements of an automatic gain controlled amplifier through the wafer such that the operating temperature of the wafer is controlled as a function of received signal strength.

A more complete understanding of the present invention as well as its many objects and features of advantage may be obtained through a reading of the following application, especially when taken in connection with the accompanying drawings, in which.

Figures 1, 2, 3:
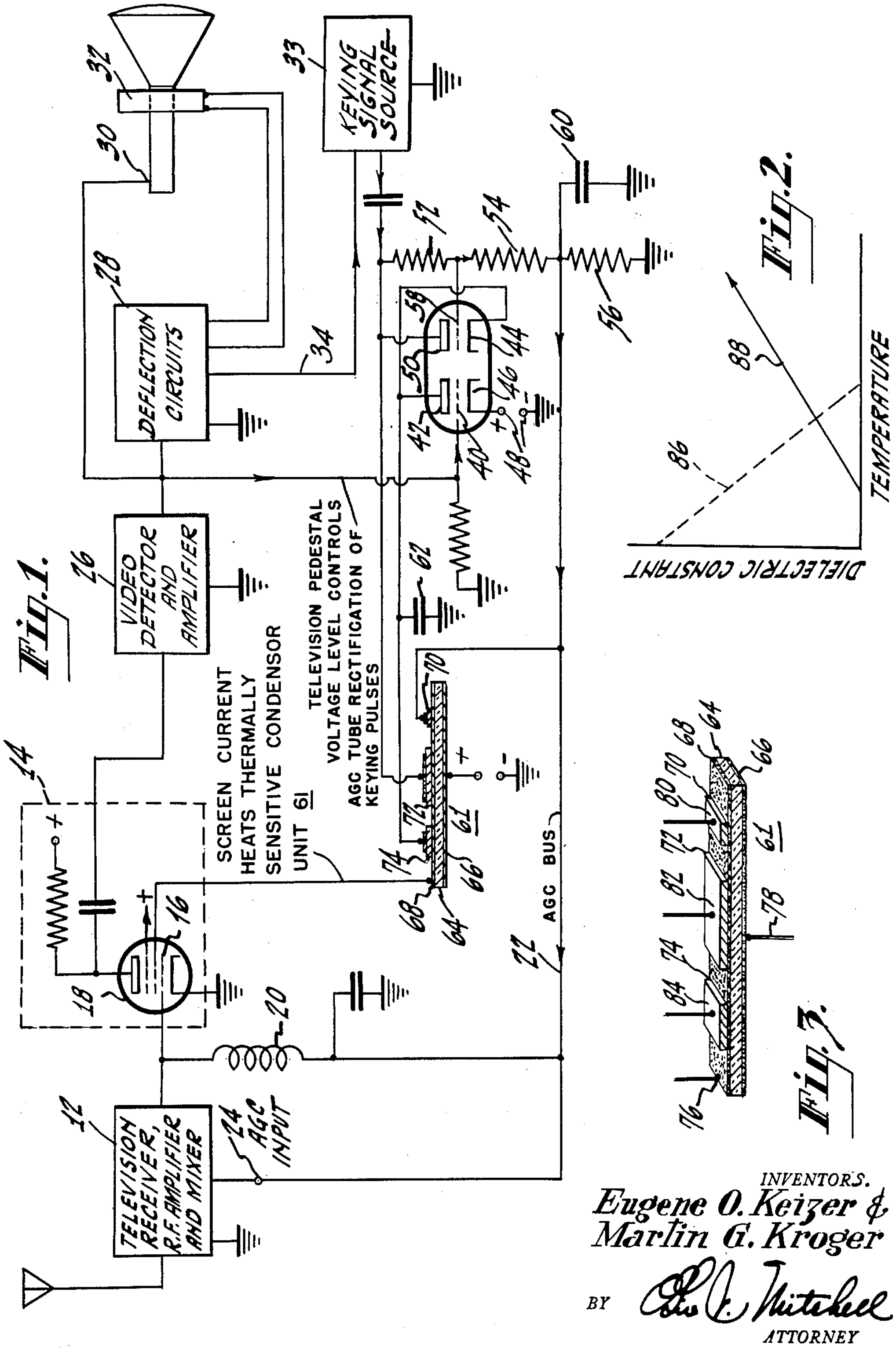
Fig. 1 is a combination block and schematic representation of a television receiving system in which the present invention is embodied.
Fig. 2 is a graphical presentation of the dielectric temperature coefficient of certain materials suitable for use in the present invention.
Fig. 3 is a cutaway view in perspective of a variable capacitance control unit constructed in accordance with the present invention.

Turning now to Fig. 1, there is indicated at 10, a television receiving antenna coupled with the conventional elements of a television receiver designated in block 12. The element within the dotted line area 14 corresponds to a television intermediate frequency amplifier. The control grid 16 of the intermediate frequency amplifier tube 18 is supplied with automatic gain control voltage through the inductor 20 whose lower extremity is connected with the automatic gain control bus 22. Automatic gain control voltage appearing on the bus 22 is also applied to the AGC terminal 24 connected with suitable elements within the block 12.

Output signal from the video I. F. amplifier 14 is shown to be capacitively coupled to the video detector and amplifier 26. The demodulated and amplified television signal appearing at the output of block 26 is applied in the conventional manner to the deflection circuits 28 and kinescope 30. The deflection coil 32 is in turn shown conventionally driven by the deflection circuits 28. Timing signals derived from the horizontal deflection circuits are applied to a keying signal source 33 via the circuit path 34. The keying signal 36 developed by the keying signal source 33 is then used as a power supply source for the automatic gain control circuit based on the double triode tube 38.

The automatic gain control shown in connection with the television receiving circuit of Fig. 1 functions as follows: Demodulated video signal derived from the output of the video detector and amplifier 26 is applied to the control electrode 40 of the left hand triode of tube envelope 38. The anode 42 is connected with the cathode 44 of the right hand triode. The cathode 46 of the left hand triode is connected with a suitable source of AGC threshold bias potential shown at 48. The anode 50 of the right hand triode is connected through the load resistance means 52, 54 and 56 to circuit ground. The control electrode 58 is connected to the junction of resistors 52 and 54. With the connections just described the right hand triode is placed in series with the left hand triode such that the left hand triode forms a cathode load circuit for the right hand triode. Keying pulses 36 are rectified by the series triode to develop an automatic gain control potential at the upper terminal of resistor 56. Capacitor 60 is placed in shunt with the automatic gain control potential to define in part the correction time constant of the automatic gain control circuit. In effect, the correction time constant determines the speed with which the automatic gain control will operate to correct for changes in the incoming signal strength.

Variable capacitance means may be connected with the AGC circuit to optimize certain characteristics with respect to any given strength of incoming signal. For example, by increasing the value of capacitor 60 the correction speed of the AGC system will be lengthened. It is therefore desirable to increase capacitor 60 when receiving strong signals and to reduce the value of capacitor 60 when receiving weak signals. In this way, airplane flutter can be corrected for weak signals while distortion of sync will not occur due to the influence of the vertical synchronizing pulses during reception of a strong signal. The capacity between the anode 42 and circuit ground is shown as having a fixed component by reason of capacitor 62. This capacitance may be supplemented by a variable capacitance so as to render the circuit operation unkeyed in the presence of strong signals. This is possible by reason of the fact that the potential at the anode 42 will represent the amplitude of incoming sync pulses for a period after the arrival of sync the length of such period being dependent upon the decay of potential (a function of time constant) across capacitor 62. If the time constant of the load circuit connected with the anode 42 is short, conduction in the left hand triode will occur only during sync periods. On the other hand, if the time constant of the load circuit connected with anode 42 is long, circuit operation will become unkeyed since the potential across capacitor 62 will maintain itself sufficiently high during television line periods to maintain conduction in the left hand triode. Thus, by increasing the amount of capacity between the anode 42 and circuit ground in the presence of strong signals, lock-out of the deflection circuit synchronization on parts of the video signal other than sync may be prevented by causing unkeyed operation. Where greater noise immunity is required, keyed operation (by reducing the time constant of the left hand triode circuit) will prevent noise from affecting the development of automatic gain control during the television line interval between sync pulses.

It is known that in keyed automatic gain control circuits that the amount of AGC voltage charge produced by a given burst of noise may be reduced by decreasing the amplitude of keying signal under weak signal conditions. Under strong signal conditions the amplitude of the keying pulse is made desirably greater. By increasing the capacity at the anode 50 of the right hand triode, the amplitude of keying pulses effective at the anode 50 is reduced. This occurs by reason of the capacitive voltage divider network which is established between the keying pulse coupling capacitor and the anode to ground capacitance of the right hand triode. During strong signal conditions the value of capacity to ground at the anode 50 may be reduced to increase the amplitude of keying pulses actually applied to the anode 50. During weak signal reception the reverse action may be involved.

In accordance with the present invention, a variable capacitance unit 61 is provided having a wafer-like heating element 64. Electrodes 66 and 68 are conductively coupled to the wafer surface 64. In this way, electrical current may be passed through the material 64. Since the lower wafer electrode 66 is connected with a source of positive potential 68, the upper electrode 68 may be directly connected with the screen grid of the amplifier 18. Screen grid current passing through the heating wafer 64 will therefore cause heating of the working surface of the wafer.

In further accordance with the present invention, a plurality of dielectric blocks are positioned on the working surface of the heater wafer. These blocks, 70, 72 and 74 may be composed of different dielectric materials each having a different temperature coefficient, as will be discussed more fully hereinafter. Electrically conductive electrode means are fastened to the dielectric blocks to form a first, second and third capacitors.

A more detailed showing of one manner in which the variable capacitance unit 62 may be constructed is shown in Fig. 3, where the heating wafer 64 is shown sandwiched between the two conductive surface elements 66 and 68. A connection to the upper surface element 76 taken in combination with the connection 78 to the lower surface element 66 provides means for passing a current through the wafer material 64. The dielectric blocks 70, 72 and 74 are shown to have a conductive coating such as a silver deposit on their upper surfaces. This conductive coating is shown at 80, 82 and 84, each acting as one electrode of a capacitor. Since the dielectric material 70, 72 and 74 is made temperature responsive, the capacitance between each of the electrodes 80, 82 and 84 with respect to the conductive surface 68 will vary as a function of the temperature of the dielectric material.

From the above analysis given of the automatic gain control circuit shown in Fig. 1 it can be seen that as the received signal strength falls it is desirable to have the capacitance of the elements 80 and 84 decrease. Under weak signal conditions the automatic gain control voltage swings more positive and of course causes a larger screen current in tube 18. This results in a heating of the wafer material which increases the temperature of the dielectrics 70 and 74. To get a reduction in capacitance under these conditions the negative temperature coefficient characteristic shown by the dotted line curve at 86 in Fig. 3 is desirable. However, as the signal strength decreases and the temperature of the dielectric material 72 increases, it is desirable that the capacitance between the electrode 82 and the surface 68 increase to reduce the effective amplitude of the keying pulses appearing at anode 50 of the right hand electrode. This is accomplished by a dielectric material having a positive temperature coefficient as illustrated for example by the solid line curve 88 in Fig. 2.

Purely by way of example, in the construction of the variable capacitance unit illustrated in Figs. 1 and 3, it has been found that the heating wafer 64 may be made of a mixture of 30% micronized magnetite with 70% barium-strontium titanate compound. The 70% titanate compound is in turn composed of approximately 70% barium titanate and 30% strontium titanate. The dielectric having a negative temperature coefficient for use as the dielectric at 70 and 74 (in the drawing) can be made up of a mixture of 90% barium-strontium titanate and 10% calcium titanate. These materials are given only by way of example, and their statement herein is in no way intended to limit the scope of practice of the present invention. For example, in lieu of barium strontium titanate a copper titanate could be used. The positive temperature coefficient dielectric at 72 may be pure barium titanate.

It will be understood that the thinner the heating wafer 64 is made, the quicker the response for the television receiver will be evident. In practice, a wafer of heating material 2 mils thick, 5 mils wide and 20 mils long is satisfactory. If various speeds of response are desired, it is possible to vary the thickness of the heating wafer in the vicinities of the capacitor dielectric blocks involved.

What is claimed is:

1. An electrically controllable variable capacitance apparatus comprising in combination: a body of electrically conductive material of relatively high resistivity suitable for use as a heater element, said body having working surface areas thereon which undergo temperature change upon current flow through said body; electrical connection means fastened to said body to permit a flow of heating current to be established in said body; a first body of non-conducting dielectric material fastened to one area of said working surface and having a positive dielectric temperature coefficient; a second body of non-conducting dielectric material fastened to another area of said working surface and having a negative dielectric temperature coefficient; conduction means fastened to each of said bodies of dielectric material to establish capacitances between said conduction means and said conductive body, the value of capacitances established by said conduction means being a function of the temperature of said conductive body.

2. A variable capacitance unit comprising in combination: a heater body having electrical terminals designated to conduct heater current flow through said heater body; a first block of temperature sensitive dielectric material fastened in heat transferring relation to one point on said heater body, said first block of dielectric material having a predetermined temperature coefficient; a second block of temperature sensitive dielectric material fastened in heat transferring relation to another point on said heater body, said second dielectric material having a different temperature coefficient inverse to said first block of dielectric material; electrically conductive electrode means fastened to said first and second blocks to establish electrical capacitances the value of which depend upon the temperature of said respective dielectric materials such that any change in the capacitance defined by said first block and second block are in opposite directions for a given temperature change in said heater body.

3. A variable capacitance unit comprising in combination: a heater body of relatively high resistivity material comprising a mixture of titanate and micronized iron oxide; electrically conductive means fastened to said body to direct heater current flow through said body; a first block of temperature sensitive dielectric material comprising a mixture of barium-strontium titanate and calcium titanate, said first block being mounted in thermal transfer relation to said heater body; a second block of temperature sensitive dielectric material comprising barium titanate; electrically conductive electrode and terminal means fastened to said first and second blocks to define first and second capacitance elements of a value respectively depending upon the temperature of said first and second blocks.

4. A variable capacitance controlled automatic gain controlled system for a television receiver comprising in combination: a circuit ground terminal means; a television signal processing circuit including an automatic gain control circuit having a first, second, and third capacity responsive control terminals for respectively controlling the correction speed, keying mode and intensity of keying in said gain control circuit, said control terminals being referenced to said ground terminal means; a wafer of relatively high resistivity heater material having a first and second electrically conductive connection means fastened theretof to direct current flow through said wafer; electrical connections from said signal processing circuit to said wafer terminal means, from a position in said processing circuit establishing through said wafer a current flow which is a function of automatic gain control potential developed by said automatic gain control circuit, said connections further being such as to establish said wafer terminal means at substantially ground potential for higher order television signal frequencies; a first, second and third bodies of temperature responsive dielectric material fastened in thermal transfer relation to said wafer; electrode means fastened to said dielectric bodies so as to form a first, second and third capacitance units all having a common electrode defined by one of said wafer conductive connection means; and electrical connections from said first, second and third capacitance units to said first, second and third capacitive responsive control terminals whereby said correction speed keying mode and intensity of keying in said automatic gain control circuit are together rendered a function of received signal strength.

5. A variable capacity controlled automatic gain control system according to claim 4 wherein there is provided in said signal processing circuit an automatic gain controlled signal amplifier whose operating current demand is rendered a function of developed automatic gain control potential and wherein said electrical connections form said signal processing circuit to said wafer terminal means includes means connected between said automatic gain controlled amplifier and said wafer terminal means such that operating current for said amplifier is caused to pass through said wafer.

6. A variable capacity automatic gain control system according to claim 5 wherein one of said dielectric bodies contains a mixture of barium-strontium titanate with calcium titanate so as to display a negative temperature coefficient while another of said dielectric bodies contains barium titanate having a positive temperature coefficient.

References Cited in the file of this patent

UNITED STATES PATENTS

| | | |
|---|---|---|
| 2,151,752 | Ellis | Mar. 28, 1939 |
| 2,642,476 | Bugell | June 16, 1953 |
| 2,648,823 | Koch et al. | Aug. 11, 1953 |
| 2,635,184 | Cotsworth III | Apr. 14, 1953 |